(12) United States Patent
Gotanda et al.

(10) Patent No.: US 12,347,630 B2
(45) Date of Patent: Jul. 1, 2025

(54) MULTILAYER JUNCTION PHOTOELECTRIC CONVERTER AND METHOD FOR MANUFACTURING MULTILAYER JUNCTION PHOTOELECTRIC CONVERTER

(71) Applicants: KABUSHIKI KAISHA TOSHIBA, Tokyo (JP); Toshiba Energy Systems & Solutions Corporation, Kawasaki (JP)

(72) Inventors: Takeshi Gotanda, Yokohama Kanagawa (JP); Tsuyoshi Asatani, Fujisawa Kanagawa (JP); Yutaka Saita, Yokohama Kanagawa (JP); Tomohiro Tobari, Yokohama Kanagawa (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 18/185,345

(22) Filed: Mar. 16, 2023

(65) Prior Publication Data

US 2023/0298826 A1 Sep. 21, 2023

(30) Foreign Application Priority Data

Mar. 18, 2022 (JP) ................. 2022-044709

(51) Int. Cl.
*H01L 31/00* (2006.01)
*H01G 9/00* (2006.01)
(Continued)

(52) U.S. Cl.
CPC ......... *H01G 9/2072* (2013.01); *H01G 9/0036* (2013.01); *H01G 9/2009* (2013.01);
(Continued)

(58) Field of Classification Search
CPC .. H01G 9/2072; H01G 9/0036; H01G 9/2009; H10K 30/30; H10K 30/40;
(Continued)

(56) References Cited

U.S. PATENT DOCUMENTS

2003/0013008 A1* 1/2003 Ono ................ H01G 9/2018
429/111
2003/0230335 A1* 12/2003 Tsukahara ............. B82Y 30/00
423/608
(Continued)

FOREIGN PATENT DOCUMENTS

CN 111261784 A 6/2020
EP 3 358 637 A1 8/2018
(Continued)

OTHER PUBLICATIONS

Machine Translation of JP2016-167511, pp. 1-21. (Year: 2016).*
(Continued)

*Primary Examiner* — Thanh Truc Trinh
(74) *Attorney, Agent, or Firm* — Finnegan, Henderson, Farabow, Garrett & Dunner, LLP

(57) ABSTRACT

A multilayer junction photoelectric converter and a multilayer junction photoelectric converter manufacturing method capable of preventing water from contacting a perovskite layer are provided.
A multilayer junction photoelectric converter of an embodiment includes a multilayered-structure. In the multilayered-structure, a first electrode functional layer, a first photoactive layer, an intermediate functional layer, a second photoactive layer, and a second electrode functional layer are multilayered. The first photoactive layer is made of crystalline silicon. The second photoactive layer is made of a photoactive material having a perovskite crystal structure. A partial layer included in the second electrode functional layer is included in the multilayered-structure and extends (Continued)

on an edge surface of the multilayered-structure to cover an end portion of the second photoactive layer at the edge surface.

3 Claims, 10 Drawing Sheets

(51) Int. Cl.
  *H01G 9/20* (2006.01)
  *H10K 30/30* (2023.01)
  *H10K 30/40* (2023.01)
  *H10K 30/82* (2023.01)
  *H10K 39/15* (2023.01)

(52) U.S. Cl.
  CPC .......... *H10K 30/30* (2023.02); *H10K 30/40* (2023.02); *H10K 30/82* (2023.02); *H10K 39/15* (2023.02)

(58) Field of Classification Search
  CPC ........ H10K 30/82; H10K 39/15; H10K 30/81; H10K 30/85; H10K 30/86; H10K 30/57; Y02E 10/549
  See application file for complete search history.

(56) References Cited

U.S. PATENT DOCUMENTS

| | | | | |
|---|---|---|---|---|
| 2008/0308155 | A1* | 12/2008 | Fukui | H01G 9/2031 136/261 |
| 2013/0255765 | A1* | 10/2013 | Gee | H01L 31/068 438/93 |
| 2014/0238476 | A1 | 8/2014 | Konishi et al. | |
| 2017/0018371 | A1* | 1/2017 | Suzuka | H10K 85/50 |
| 2018/0174761 | A1* | 6/2018 | Kamino | H10K 30/151 |
| 2018/0175112 | A1 | 6/2018 | Robinson et al. | |
| 2018/0190919 | A1 | 7/2018 | Schmidt et al. | |

FOREIGN PATENT DOCUMENTS

| | | | |
|---|---|---|---|
| EP | 3 457 448 | A1 | 3/2019 |
| JP | 2015-153831 | A | 8/2015 |
| JP | 2016167511 | * | 9/2016 |
| JP | 2017-508294 | A | 3/2017 |
| JP | 2018-517304 | A | 6/2018 |
| JP | 6506837 | B2 | 4/2019 |
| JP | 6650462 | B2 | 2/2020 |
| JP | 6670377 | B2 | 3/2020 |
| JP | 6681754 | B2 | 4/2020 |
| JP | 2022-910 | A | 1/2022 |
| WO | WO 2013/061637 | A1 | 5/2013 |
| WO | WO 2016/158838 | A1 | 10/2016 |
| WO | WO 2017/195722 | A1 | 11/2017 |
| WO | WO 2022/079887 | A1 | 4/2022 |
| WO | WO 2022/080196 | A1 | 4/2022 |
| WO | WO 2022/101969 | A1 | 5/2022 |
| WO | WO 2022/102128 | A1 | 5/2022 |

OTHER PUBLICATIONS

State Intellectual Property Office of People's Republic of China, First Office Action in CN Application No. 202310032173.0, 5 pages and machine translation, 7 pages (Apr. 26, 2024).

Chufeng Qiu et al., "Efficient planar perovskite solar cells with ZnO electron transport layer.", Coatings, vol. 12, Art.-No. 1981 S. 1-19 (2022).

Manoj Jaysankar et al., "Four-terminal perovskite/silicon multijunction solar modules.", Advanced energy materials, vol. 7, No. 15, Art.-Nr. 1602807, 8 S (2017).

Deutsches Patent- und Merkenamt, Office Action in DE Patent App. No. 102023106644.7, 8 pages, with machine translation, 10 pages (Jan. 24, 2025).

* cited by examiner

MULTILAYER JUNCTION PHOTOELECTRIC CONVERTER AND METHOD FOR MANUFACTURING MULTILAYER JUNCTION PHOTOELECTRIC CONVERTER

FIELD

Embodiments of the present invention relate to a multilayer junction photoelectric converter and a method for manufacturing a multilayer junction photoelectric converter.

BACKGROUND

As a multilayer junction photoelectric converter, a tandem solar cell has been known. The tandem solar cell has a configuration in which a second photoelectric converter including a second photoactive layer is provided on a light receiving surface side of a semiconductor substrate and a first photoelectric converter allowing this semiconductor substrate to function as a first photoactive layer is provided on the side opposite to the light receiving surface of the semiconductor substrate. As the second photoactive layer, a photoactive layer made of a material having a perovskite crystal structure (hereinafter, referred to as a perovskite layer) is known.

In the multilayer junction photoelectric converter having the perovskite layer, the perovskite layer is structurally exposed on the edge surface. Therefore, the perovskite layer is in a state that the layer easily contacts water. When the perovskite layer contacts water, the perovskite layer is decomposed. Accordingly, the short circuit of the first photoelectric converter may occur. Related art of this multilayer junction photoelectric converter has been disclosed in International Publication No. 2016/158838.

DETAILED DESCRIPTION OF THE INVENTION

Hereinafter, a multilayer junction photoelectric converter and a multilayer junction photoelectric converter manufacturing method of an embodiment will be described with reference to the drawings.

First Embodiment

Figure 1:
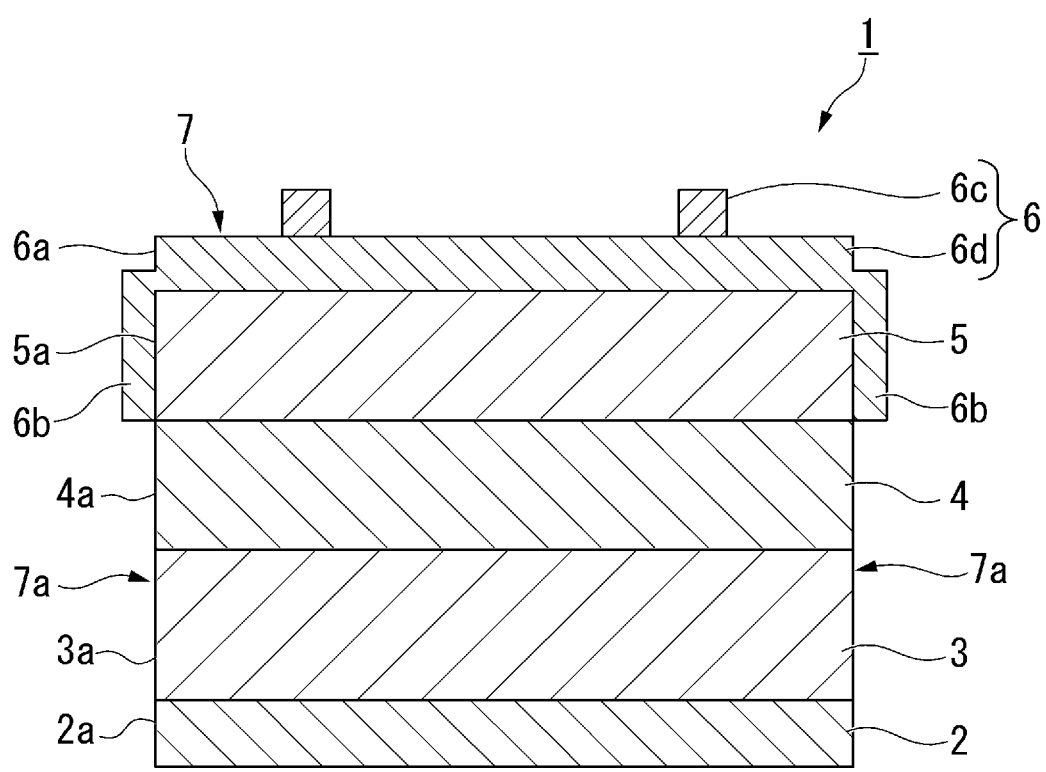
FIG. 1 is a schematic cross-sectional view showing a multilayer junction photoelectric converter of a first embodiment.

FIG. 1 shows a multilayer junction photoelectric converter 1 of a first embodiment. The multilayer junction photoelectric converter 1 shown in FIG. 1 is configured by a multilayered-structure 7 obtained by stacking a first electrode functional layer 2, a first photoactive layer 3 made of crystalline silicon, an intermediate functional layer 4, a second photoactive layer 5 made of a photoactive material having a perovskite crystal structure, and a second electrode functional layer 6. In the multilayer junction photoelectric converter 1 shown in FIG. 1, the light receiving surfaces of the first photoactive layer 3 and the second photoactive layer 5 are the surfaces on the side of the second electrode functional layer 6.

An end portion 2a of the first electrode functional layer 2, an end portion 3a of the first photoactive layer 3, an end portion 4a of the intermediate functional layer 4, an end portion 5a of the second photoactive layer 5, and an end portion 6a of the second electrode functional layer 6 are located on an edge surface 7a of the multilayered-structure 7.

In the multilayer junction photoelectric converter 1 shown in FIG. 1, a partial layer 6b included in the second electrode functional layer 6 is included in the multilayered-structure 7 and extends cover a part of the edge surface 7a of the multilayered-structure 7. Specifically, the partial layer 6b included in the second electrode functional layer 6 extends on the edge surface 7a to cover the end portion 5a of the second photoactive layer 5. Accordingly, the end portion 5a of the second photoactive layer 5 is covered with the partial layer 6b included in the second electrode functional layer 6.

The first electrode functional layer 2 may include a first electrode and a first conductive layer disposed between the first electrode and the first photoactive layer.

The first photoactive layer 3 includes a first conductive type crystalline silicon layer. The crystalline silicon forming the first photoactive layer 3 can adopt the same structure as silicon generally used for photovoltaic cells. Specific examples include crystalline silicon including crystalline silicon such as single crystallinesilicon, polycrystalline silicon, and heterojunction silicon. Further, the crystalline silicon may be a thin film cut from a silicon wafer. As the silicon wafer, an n-type silicon crystal doped with phosphorus, arsenic, or the like, or a p-type silicon crystal doped with boron, gallium, or the like can be used. Since electrons in p-type silicon crystal have a long diffusion length, p-type crystalline silicon is preferred as the first conductive type crystalline silicon.

The intermediate functional layer 4 has at least a function of connecting in series a bottom cell mainly composed of the first photoactive layer 3 and a top cell mainly composed of the second photoactive layer 5. The intermediate functional layer 4 may include, for example, a second conductive layer which contacts the first photoactive layer 3, a transparent conductive layer, and a first functional layer which contacts the second photoactive layer 5.

The second photoactive layer 5 is made of a photoactive material having a perovskite crystal structure. The perovskite crystal structure means the same crystal structure as perovskite. Typically, the perovskite structure consists of ions A, B, and X, and may form a perovskite structure when ion B is smaller than ion A. The chemical composition of this crystal structure can be represented by the following general formula (1).

$$ABX_3 \tag{1}$$

A can utilize primary ammonium ions. Specific examples include  $CH_3NH_3^+$ (hereinafter, sometimes referred to as MA), $C_2H_5NH_3^+$, $C_3H_7NH_3^+$, $C_4H_9NH_3^+$, and $HC(NH_2)_2^+$ (hereinafter, sometimes referred to as FA). $CH_3NH_3^+$ is preferable, but the present invention is not limited thereto. Further, A is also preferably $Cs^+$, 1,1,1-trifluoro-ethylammonium iodide (FEAT), but the present invention is not limited thereto.

B is a divalent metal ion and is preferably $Pb^{2+}$ or $Sn^{2+}$. However, the present invention is not limited thereto. Further, X is preferably a halogen ion. For example, X is selected from $F^-$, $Cl^-$, $Br^-$, $I^-$, and $At^-$ and $Cl^-$, $Br^-$, and $I^-$ are preferable. However, the present invention is not limited thereto.

The materials that constitute the ions A, B or X may each be single or mixed. The constituent ions can function without necessarily matching the stoichiometry of $ABX_3$.

The ions A constituting the perovskite of the second photoactive layer 5 preferably have an atomic weight or a total atomic weight (molecular weight) constituting ions of 45 or more. It is more preferable to contain ions of 133 or less. Since ion A under these conditions has low stability by itself, general MA (molecular weight 32) is mixed in some cases. However, when MA is mixed, the band gap approaches 1.1 eV of silicon. Accordingly, as a tandem that improves efficiency by wavelength division, it is not preferable because the overall characteristics deteriorate. Moreover, when the ions A are a combination of a plurality of ions and contain Cs, the ratio of the number of Cs to the total number of ions A is more preferably 0.1 to 0.9.

This crystal structure has a unit cell such as a cubic, tetragonal, or rectangular crystal such that A is placed at each vertex, B is placed at the body center, and X is placed at each face center of the cubic crystal with this as the center. In this crystal structure, the octahedron consisting of one B and six Xs contained in the unit cell is easily distorted by the interaction with A and undergoes a phase transition to a symmetrical crystal. It is presumed that this phase transition dramatically changes the physical properties of the crystal to thereby cause electrons or holes to be emitted out of the crystal and generate electricity.

The second electrode functional layer 6 may include a second electrode 6c and a second functional layer 6d disposed between the second electrode 6c and the second photoactive layer 5. The second functional layer 6d extends on the edge surface of the multilayered-structure 7 to cover the end portion 5a of the second photoactive layer 5 as the partial layer 6b included in the second electrode functional layer 6.

In the first functional layer (not shown) included in the intermediate functional layer 4 and the second functional layer 6d included in the second electrode functional layer 6, one of them functions as a hole transport layer and the other functions as an electron transport layer with respect to the second photoactive layer 5. In order for the multilayer junction photoelectric converter 1 of this embodiment to achieve higher conversion efficiency, it is preferable to include both of these layers, but at least only the second functional layer 6d may be provided.

The first conductive layer (not shown) included in the first electrode functional layer 2 and the second conductive layer (not shown) included in the intermediate functional layer 4 may be obtained by combining an n-type layer, a p-type layer, a p+-type layer, a p++-type layer, and the like according to purposes such as improving carrier collection efficiency depending on the properties of the first photoactive layer 3. Specifically, when p-type silicon is used as the first photoactive layer 3, a phosphorus-doped silicon film (n layer) can be combined as the second conductive layer and a p+ layer can be combined as the first conductive layer.

The multilayer junction photoelectric converter 1 shown in FIG. 1 is a tandem solar cell having a structure in which two photoactive layers 3 and 5 are provided, the unit having the second photoactive layer 5 is a top cell, the unit having the first photoactive layer 3 is a bottom cell, and these are connected in series by the intermediate functional layer 4. The first electrode functional layer 2 and the second electrode functional layer 6 serve as anodes or cathodes and electrical energy generated by the element is extracted therefrom.

In the multilayer junction photoelectric converter 1 shown in FIG. 1, the partial layer 6b included in the second electrode functional layer 6 extends on the edge surface 7a to cover the end portion 5a of the second photoactive layer 5. The end portion 5a of the second photoactive layer 5 is covered with the partial layer 6b included in the second electrode functional layer 6. Accordingly, there is no risk that water will adhere to the second photoactive layer 5 from the outside of the element 1 and there is no risk that the photoactive material having a perovskite crystal structure forming the second photoactive layer 5 will be decomposed by water. Accordingly, this can prevent the short circuit of the top cell.

Additionally, the present invention is not limited to the example shown in FIG. 1 and the partial layer 6b included in the second electrode functional layer 6 may be extended and multilayered on the edge surface 7a to cover up to the end portion 3a of the first photoactive layer 3. Water may enter through the interface between the end portion 7a of the multilayered-structure 7 and the partial layer 6b included in the second electrode functional layer 6. However, since the water entry path is lengthened by extending the partial layer 6b included in the second electrode functional layer 6 to the first photoactive layer 3, the risk of water entering the second photoactive layer 5 from the outside of the element 1 can be further reduced.

Second Embodiment

Figure 2:
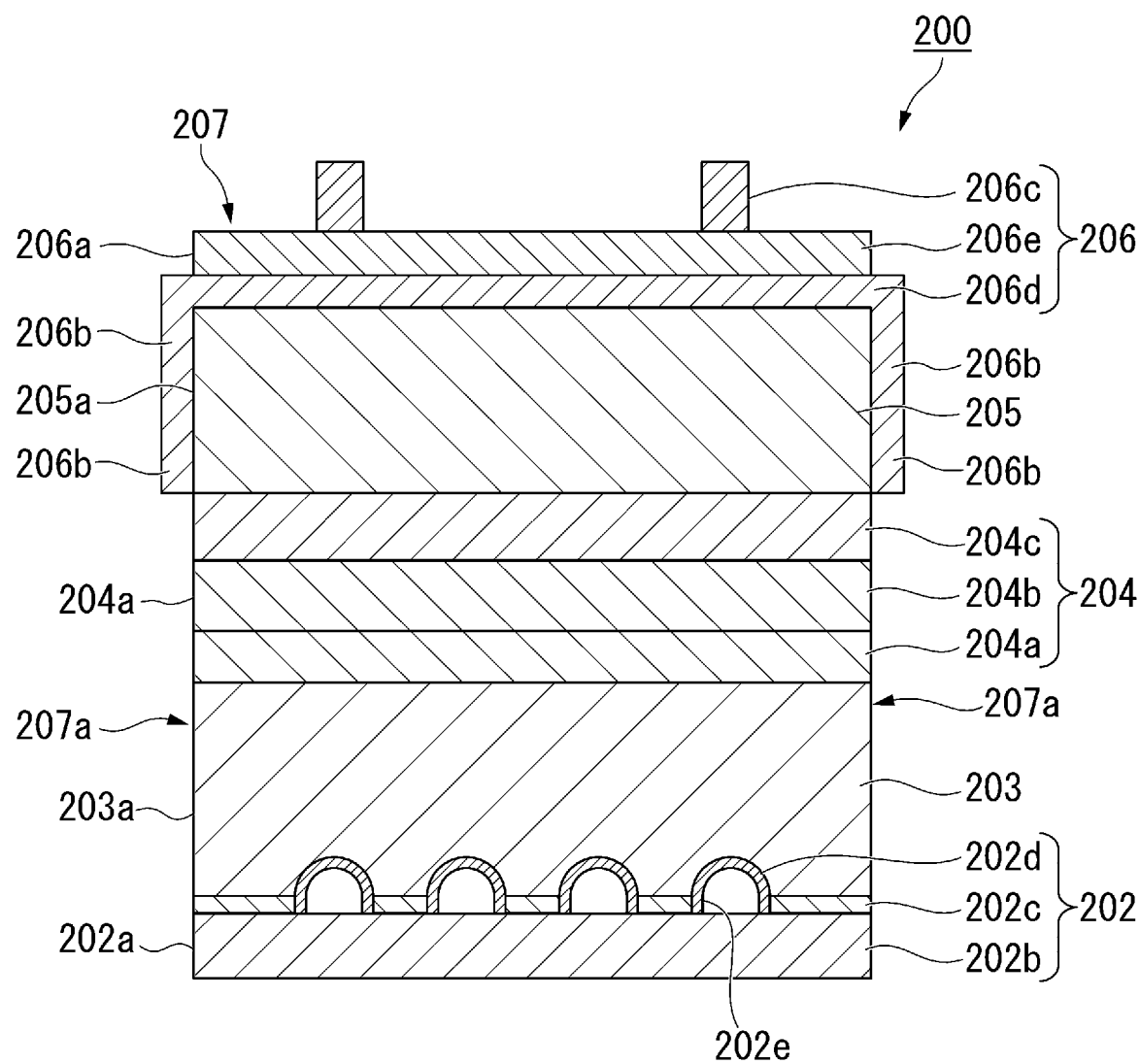
FIG. 2 is a schematic cross-sectional view showing a multilayer junction photoelectric converter of a second embodiment.

FIG. 2 shows a multilayer junction photoelectric converter 200 of a second embodiment. The multilayer junction photoelectric converter 200 shown in FIG. 2 is configured by a multilayered-structure 207 obtained by stacking a first electrode functional layer 202, a first photoactive layer 203 made of crystalline silicon, an intermediate functional layer 204, a second photoactive layer 205 made of a photoactive material having a perovskite crystal structure, and a second electrode functional layer 206. In the multilayer junction photoelectric converter 200 shown in FIG. 2, the light receiving surfaces of the first photoactive layer 203 and the second photoactive layer 205 are the surfaces on the side of the second electrode functional layer 206.

An end portion 202a of the first electrode functional layer 202, an end portion 203a of the first photoactive layer 203, an end portion 204a of the intermediate functional layer 204, an end portion 205a of the second photoactive layer 205, and an end portion 206a of the second electrode functional layer 206 are located on an edge surface 207a of the multilayered-structure 207. Then, a partial layer (hereinafter, referred to as a covering layer 206b) included in the second electrode functional layer 206 is included in the multilayered-structure 207 and extends to cover a part of the edge surface 207a of the multilayered-structure 207.

Hereinafter, a configuration of the multilayered-structure 207 of the multilayer junction photoelectric converter 200 of this embodiment will be sequentially described.

The first electrode functional layer 202 includes a first electrode 202b, a passivation film 202c, and a first conductive layer 202d.

The first electrode 202b is formed to cover the entire surface of the first photoactive layer 203. The first electrode 202b can function as an electrode and also as a reflective layer that reflects incident light. That is, the light that could not be absorbed by the first photoactive layer 203 and the second photoactive layer 205 can be reflected and absorbed again by the first photoactive layer 203 and the second photoactive layer 205. As a result, the amount of generated current can be increased.

The first electrode 202b can be selected from any conventionally known material as long as it has conductivity. Gold, silver, copper, platinum, aluminum, titanium, iron, palladium, and the like are used as the material of the first electrode 202b, but aluminum or silver is preferable. Aluminum is particularly preferred from the standpoints of light reflectivity and cost.

The thickness of the first electrode 202b is preferably 10 to 10000 nm, more preferably 15 to 1000 nm, and particularly preferably 20 to 300 nm.

The passivation film 202c is disposed between the first photoactive layer 203 and the first electrode 202b. The passivation film 202c electrically insulates the first photoactive layer 203 and the first electrode 202b, but includes an opening portion 202e. The first conductive layer 202d ensures the electrical connection between the first photoactive layer 203 and the first electrode 202b through the opening portion 202e. Therefore, since the carrier movable area is limited, carriers can be efficiently collected.

A material used for forming the passivation film 202c is not particularly limited. Specifically, a silicon oxide film formed by thermally oxidizing a surface of a silicon material, films of AlOx and SiNx formed by plasma-enhanced chemical vapor deposition (PECVD), plasma-assisted atomic layer deposition (PAALD), and the like can be mentioned.

The first conductive layer 202d is a layer which is disposed between the first photoactive layer 203 and the first electrode 202b. The first conductive layer 202d may be obtained by combining an n-type layer, a p-type layer, a p+-type layer, a p++-type layer, and the like according to purposes such as improving carrier collection efficiency depending on the properties of the first photoactive layer 203 together with a second conductive layer 204a to be described later. For example, when p-type silicon is used as the first photoactive layer 203, a p+ layer is used as the first conductive layer 202d and a phosphorus-doped silicon film (n layer) is used as the second conductive layer 204a. For example, when p-type silicon is used as the first photoactive layer 203, the first conductive layer 202d is formed by doping the first photoactive layer 203 with Al.

The first photoactive layer 203 may be the same as the first photoactive layer 3 described in the first embodiment. The thickness of the first photoactive layer 203 is preferably 50 μm to 500 μm and more preferably 100 to 300 μm.

The intermediate functional layer 204 includes a second conductive layer 204a which contacts the first photoactive layer 203, a transparent conductive layer 204b, and a first functional layer 204c which contacts the second photoactive layer 205.

The second conductive layer 204a is a layer which is disposed between the first photoactive layer 203 and the transparent conductive layer 204b. The second conductive layer 204a can be formed, for example, by introducing necessary dopants into amorphous silicon (a-Si). That is, for example, silicon is deposited by a PECVD method or the like to form an a-Si layer, and then phosphorus is doped to form the second conductive layer 204a made of an n-type silicon layer. Alternatively, an introduction gas may be doped with phosphorus when depositing the a-Si layer by PECVD method or the like.

Since the carrier forming area can be further limited by thinning the thickness of the second conductive layer 204a, the amount of generated current can be further increased. Specifically, the thickness of the second conductive layer 204a is preferably 1 to 10 nm and more preferably 2 to 4 nm.

The transparent conductive layer 204b is disposed to contact the second conductive layer 204a. The transparent conductive layer 204b has a function of electrically connecting a bottom cell mainly composed of the first photoactive layer 203 and a top cell mainly composed of the second photoactive layer 205 while isolating them and guiding the light not absorbed by the second photoactive layer 205 to the first photoactive layer 203.

The material of the transparent conductive layer 204b can be selected from transparent or translucent conductive materials. Such materials include conductive metal oxide films. Specifically, indium oxide, zinc oxide, tin oxide, and their composites such as indium tin oxide (ITO) and indium zinc oxide (IZO) are used. The transparent conductive layer 204b made of such a metal oxide can be formed by a generally known method. Specifically, the transparent conductive layer can be formed by sputtering.

The entire thickness of the transparent conductive layer 204b is preferably 5 nm to 70 nm. When the thickness is less than 5 nm, there are many film defects, and the isolation of the layer adjacent to the transparent conductive layer 204b becomes insufficient. When the thickness is thicker than 70 nm, the light transmittance is lowered due to the diffraction effect. Accordingly, a decrease in the power generation amount on the first photoactive layer may occur.

The first functional layer 204c exists between the transparent conductive layer 204b and the second photoactive layer 205. The first functional layer 204c is a layer that transports electrons or holes and preferentially extracts them, and functions as a hole transport layer or an electron transport layer together with a second functional layer 206d to be described later.

The second photoactive layer 205 may be the same as the second photoactive layer 5 described in the first embodiment. When the thickness of the second photoactive layer 205 is increased, the amount of absorbed light increases and the short circuit current density (Jsc) increases. However, loss due to deactivation tends to increase as the carrier transportation distance increases. Therefore, there is an optimum thickness for maximum efficiency. Specifically, the thickness of the second photoactive layer 205 is preferably 30 to 1000 nm and further preferably 60 to 600 nm.

The second electrode functional layer 206 includes a second metal electrode 206c, a second transparent electrode 206e, and a second functional layer 206d. The second functional layer 206d is a partial layer included in the second electrode functional layer 206. Further, a part of the second electrode functional layer 206 extends on the edge surface 207a of the multilayered-structure 207 to cover the end portion 205a of the second photoactive layer 205 as the covering layer 206b.

The second electrode functional layer 206 is disposed on a light incident surface side. In FIG. 2, since the second metal electrode 206c and the second transparent electrode 206e respectively have different characteristics, either one or a combination may be used depending on the properties.

The second transparent electrode 206e is a transparent or translucent conductive layer. The second transparent electrode 206e may have a structure in which multiple materials are multilayered. Further, since the transparent electrode transmits light, the transparent electrode can be formed on the entire surface of the multilayered-structure.

Materials for the second transparent electrode 206e include a conductive metal oxide film, a semi-transparent metal thin film, and the like. Specifically, films (NESA and the like) made using conductive glass made of indium oxide, zinc oxide, tin oxide, and their composites such as indium tin oxide (ITO), indium zinc oxide (IZO), fluorine-doped tin oxide (FTO), and indium zinc oxide, aluminum, gold, platinum, silver, copper, and the like are used. In particular, metal oxides such as ITO or IZO are preferred. The second transparent electrode 206e made of such a metal oxide can be formed by a generally known method. Specifically, the second transparent electrode is formed by sputtering.

The thickness of the second transparent electrode 206e is preferably 30 to 300 nm. If the thickness of the second transparent electrode 206e is less than 30 nm, the conductivity tends to decrease and the resistance tends to increase. High resistance may cause a decrease in photoelectric conversion efficiency. On the other hand, when the thickness of the second transparent electrode 206e is thicker than 300 nm, the flexibility of the electrode tends to be low. As a result, if the thickness is large, it may crack when stress acts. The second transparent electrode 206e may have a single-layer structure or a multi-layer structure in which layers made of materials with different work functions are multilayered.

The second metal electrode 206c may be any material as long as the second metal electrode has electrical conductivity. Specifically, conductive materials such as gold, silver, copper, platinum, aluminum, titanium, iron, and palladium can be used.

The second metal electrode 206c has a shape in which a plurality of metal wires are arranged substantially in parallel. The thickness of the second metal electrode 206c is preferably, for example, 30 to 300 nm. If the thickness of the second metal electrode 206c is less than 30 nm, the conductivity tends to decrease and the resistance tends to increase. High resistance may cause a decrease in photoelectric conversion efficiency. If the thickness of the second metal electrode 206c is 100 nm or less, the second metal electrode has light transmittance. Accordingly, it is preferable because power generation efficiency and luminous efficiency can be improved. The second metal electrode 206c may have a single-layer structure or a multi-layer structure in which layers made of different materials are multilayered.

The second functional layer 206d exists between the second transparent electrode 206e and the second photoactive layer 205. The second functional layer 206d is a layer that transports electrons or holes and preferentially extracts them and functions as a hole transport layer or an electron transport layer.

When the second functional layer 206d functions as a hole transport layer or an electron transport layer, the second functional layer 206d is preferably made of an inorganic oxide. When the second functional layer 206d is the hole transport layer, the second functional layer 206d is preferably made of titanium oxide. Further, when the second functional layer 206d is the electron transport layer, the second functional layer 206d is preferably made of tin oxide.

When the second functional layer 206d is a hole injection layer, the thickness is preferably 30 nm or less and may be 15 to 25 nm. This is because the film resistance of the hole injection layer can be lowered and the conversion efficiency can be improved. On the other hand, the thickness of the hole injection layer may be 5 nm or more.

When the second functional layer 206d is an electron transport layer, the thickness is preferably 30 nm or less and may be 15 to 25 nm. This is because the film resistance as the electron transport layer can be lowered and the conversion efficiency can be improved. On the other hand, the thickness of the electron transport layer can be 5 nm or more.

The covering layer 206b which is a part of the second functional layer 206d extends on the edge surface 207a of the multilayered-structure 207. The covering layer 206b covers the end portion 205a of the second photoactive layer 205. The covering layer 206b is integrally formed with the second functional layer 206d and is continuous to the second functional layer 206d. The material of the covering layer 206b is the same as the material of the second functional layer 206d. That is, the covering layer 206b is made of an inorganic oxide, more specifically titanium oxide or tin oxide. Further, the thickness of the covering layer 206b is equivalent to the thickness of the second functional layer 206d.

In a multilayer junction photoelectric converter 201 shown in FIG. 2, the second functional layer 206d is included in the multilayered-structure 207 and extends on the edge surface 207a so that the covering layer 206b which is a part of the second functional layer 206d covers the end portion 205a of the second photoactive layer 205. That is, the end portion 205a of the second photoactive layer 205 is covered with the covering layer 206b. Accordingly, there is no risk that water enters the second photoactive layer 205 from the outside of the element 201 and there is no risk that the photoactive material forming the second photoactive layer 205 and having a perovskite crystal structure is decomposed by water. Accordingly, this can prevent a short circuit of the top cell.

Figure 3:
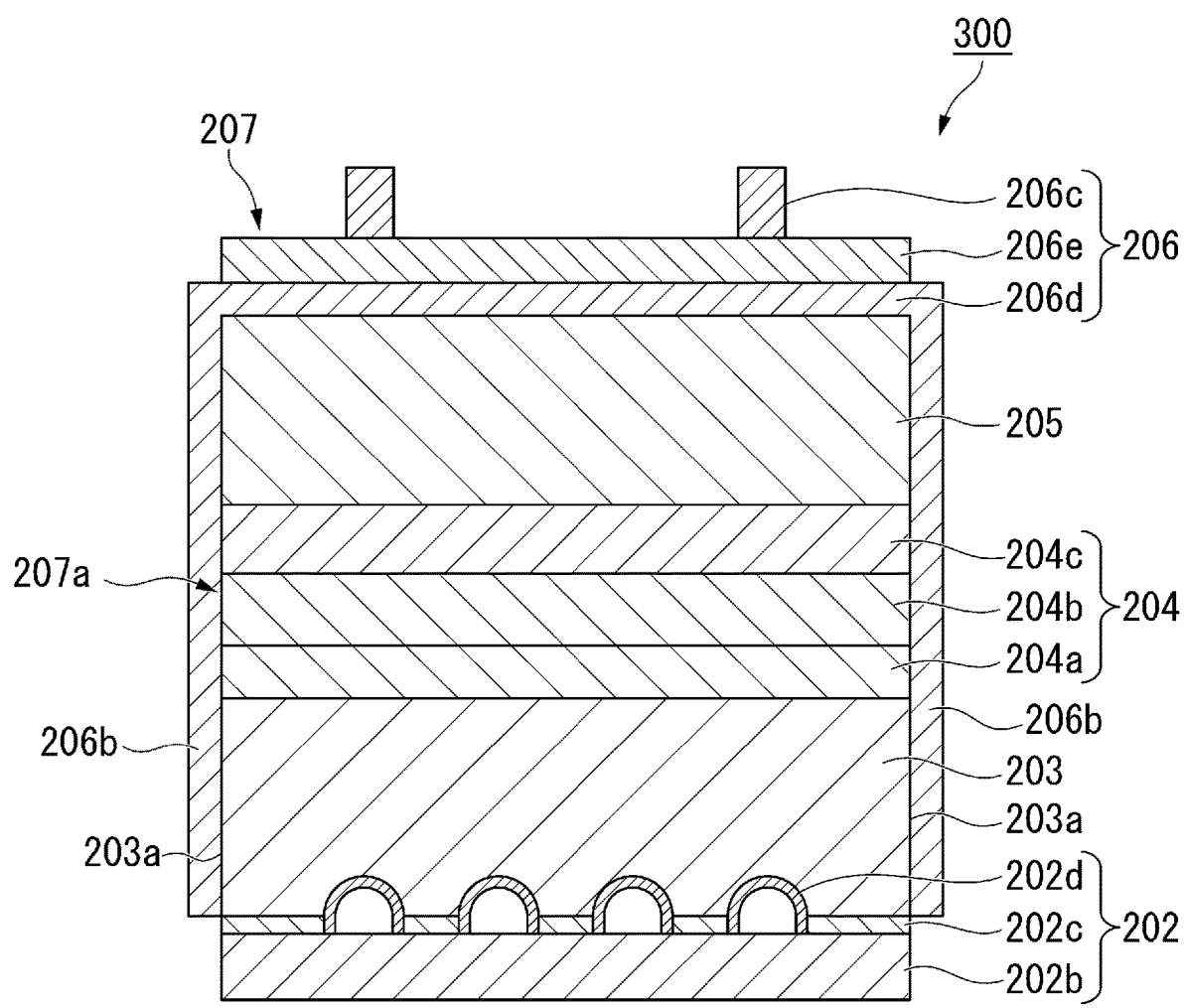
FIG. 3 is a schematic cross-sectional view showing a modified example of the multilayer junction photoelectric converter of the second embodiment.

FIG. 3 shows a modified example of this embodiment. In a multilayer junction photoelectric converter 300 shown in FIG. 3, the covering layer 206b extends on the edge surface 207a to cover up to the end portion 203a of the first photoactive layer 203. Water may enter through the interface between the edge surface 207a of the multilayered-structure 207 and the covering layer 206b. However, since the water entry path is lengthened by extending the covering layer 206b to the first photoactive layer 203, the risk of water entering the second photoactive layer 205 from the outside of the element 301 can be further reduced.

Third Embodiment

Next, a method of manufacturing a multilayer junction photoelectric converter of a third embodiment will be described. The manufacturing method of this embodiment is a manufacturing method of a modified example of the second embodiment and has a step of stacking a second electrode functional layer on an intermediate multilayered-structure. This step includes a stacking step of forming a partial layer included in the second electrode functional layer by atomic layer deposition. In this stacking step, the partial layer included in the second electrode functional layer is formed on a second photoactive layer of the intermediate multilayered-structure and on an end portion of the second photoactive layer at an edge surface of the intermediate multilayered-structure.

Figure 4:
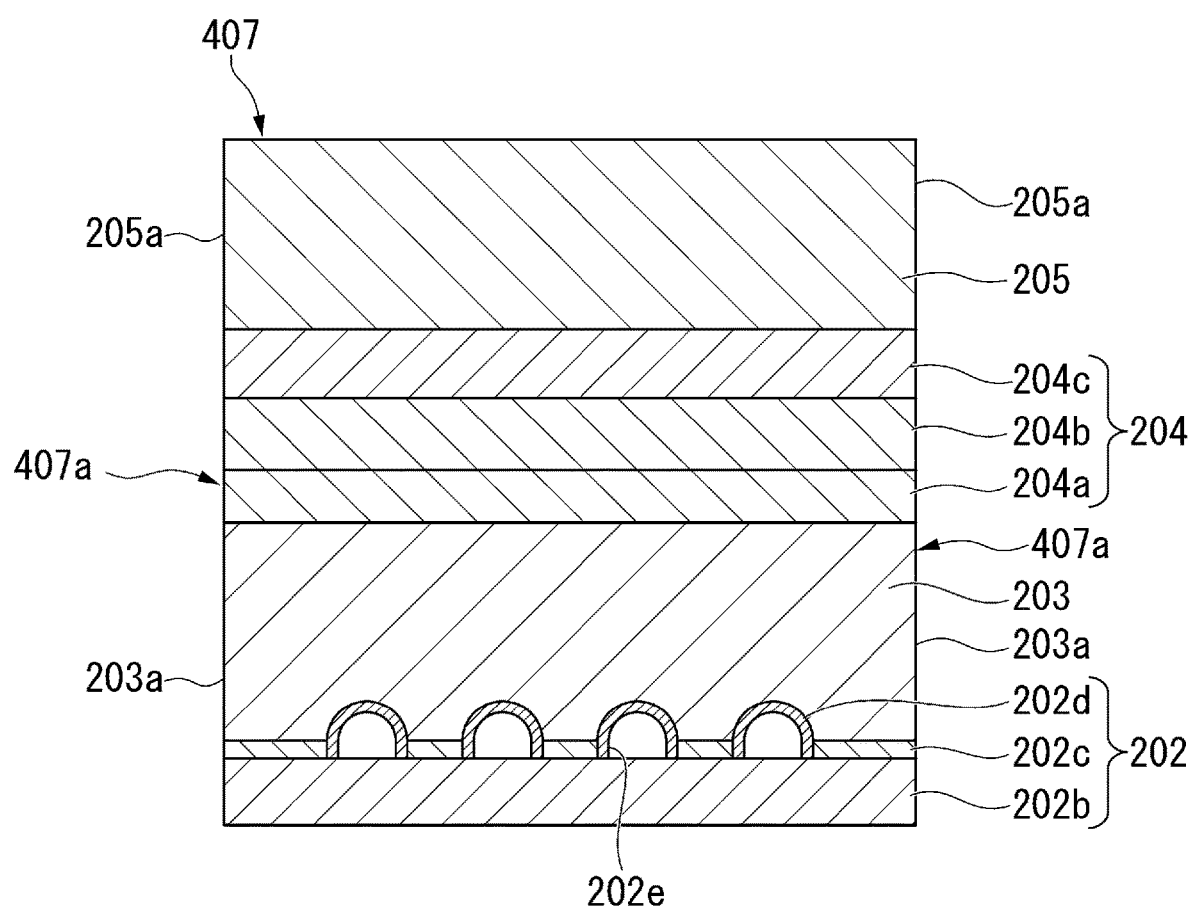
FIG. 4 is a process diagram illustrating a method of manufacturing a multilayer junction photoelectric converter of a third embodiment.

As shown in FIG. 4, an intermediate multilayered-structure 407 includes a first electrode functional layer 202, a first photoactive layer 203 made of crystalline silicon, an intermediate functional layer 204, and a second photoactive layer 205 made of a photoactive material having a perovskite crystal structure.

As described in the second embodiment, the first electrode functional layer 202 includes a first electrode 202b, a passivation film 202c which is disposed between the first electrode 202b and the first photoactive layer 203, and the first conductive layer 204 which penetrates the passivation film 202c and electrically connects the first electrode 202b and the second photoactive layer 203.

The first photoactive layer 203 is the same as that described in the second embodiment.

The intermediate functional layer 204 includes a second conductive layer 204a which extends on the second photoactive layer 203, a transparent electrode layer 204b, and a first functional layer 204c which is disposed between the transparent electrode layer 204b and the first photoactive layer 205.

The second photoactive layer 205 is the same as that described in the second embodiment.

The method of manufacturing the intermediate multilayered-structure 407 is not particularly limited, but the intermediate multilayered-structure may be manufactured, for example, in the following procedure.

That is, a crystalline silicon substrate which is the first photoactive layer 203 is prepared and the passivation film 202c is formed on one surface thereof. The passivation film 202c is formed, for example, by thermally oxidizing the surface of the crystalline silicon substrate.

Next, a paste for fire through is applied to a portion where the first conductive layer 202d is to be formed and is fired at a high temperature of 660 to 1000° C. and the paste and the passivation film 202c are reacted to form the first conductive layer 202d. In this method, the opening portion 202e is not formed in the passivation film 202c in advance, but since the passivation film 202c is denatured when the first conductive layer 204 is formed, the denatured portion of the passivation film 202c becomes the opening portion 202e in the embodiment for convenience. Additionally, the first conductive layer 202d formed by this method typically has a dome-shaped structure.

When applying a metal paste containing silver or aluminum as the fire through paste, it is preferable to use a screen printing method. The metal paste may further contain glass frit and organic solvent. When the aluminum paste is printed and then heat-treated, a p+ layer (first conductive layer 202d) in which aluminum diffuses at a high concentration is formed.

Next, the second conductive layer 204a is formed on the other surface of the crystalline silicon substrate which is the first photoactive layer 203. As described in the second embodiment, the second conductive layer 204a can be formed by introducing necessary dopants into amorphous silicon (a-Si).

Next, the transparent conductive layer 204b is formed on the second conductive layer 204a and further the first functional layer 204c is formed on the transparent conductive layer 204b. Each of the transparent conductive layer 204b and the first functional layer 204c is formed by sputtering.

Next, the second photoactive layer 205 is formed on the first functional layer 204c. From the viewpoint of cost, the second photoactive layer 205 is preferably formed by a coating method.

That is, a coating liquid containing a precursor compound having a perovskite structure and an organic solvent capable of dissolving the precursor compound is applied onto a base such as the first functional layer 204c to form a coating film. Additionally, the surface of the first functional layer 204c is preferably pre-treated to obtain high wettability with the coating liquid forming the second photoactive layer 205. Specific examples include UV-ozone treatment and plasma treatment.

Examples of the solvent used for the coating liquid include N,N-dimethylformamide (DMF), γ-butyrolactone, dimethylsulfoxide (DMSO), and the like. The solvent is not restricted as long as the solvent can dissolve the materials, and may be mixed. The second photoactive layer 205 can be formed by applying a single coating liquid in which all raw materials forming the perovskite structure are dissolved in one solution. Alternatively, a plurality of raw materials that form a perovskite structure may be separately prepared as a plurality of solutions, or a plurality of coating liquids may be prepared and applied sequentially. A spin coater, slit coater, bar coater, dip coater, or the like can be used for coating.

The coating liquid may further contain an additive. Preferred such additives are 1,8-diiodooctane (DIO) and N-cyclohexyl-2-pyrrolidone (CHP).

The coating liquid containing the perovskite structure precursor may be applied two or more times. In such a case, the second photoactive layer 205 formed in the first coating is likely to be a lattice-mismatched layer. Accordingly, coating having a relatively thin thickness is preferable. Specifically, the conditions for the second and subsequent coatings are preferably conditions for thinning the film thickness such that the rotation speed of the spin coater is relatively fast, the slit width of the slit coater or bar coater is relatively narrow, the pick-up speed of the dip coater is relatively fast, and the solute concentration in the coating liquid is relatively low.

After the perovskite structure forming reaction is completed, annealing is preferably performed to dry the solvent. Since this annealing is done to remove the solvent contained in the perovskite layer, it is preferable to perform annealing before the next layer, for example, the second functional layer 206d is formed on the second photoactive layer 205.

As described above, the intermediate multilayered-structure 407 is manufactured.

Next, a step of stacking the second electrode functional layer on the second photoactive layer 205 of the intermediate multilayered-structure 407 is performed. The step of stacking the second electrode functional layer includes a step of forming the second functional layer 206d and a step of forming the second transparent electrode 206e and the second metal electrode 206c.

In the step of forming the second functional layer 206d, the second functional layer 206d which is a partial layer included in the second electrode functional layer is formed by atomic layer deposition. In the atomic layer deposition, a surface on which the second functional layer 206d is formed is alternately exposed to a plurality of vapor-phase raw materials (precursors) to form the second functional layer 204c. Accordingly, the second functional layer 206d extends on not only the upper surface of the second photoactive layer 205 but also the edge surface 407a of the intermediate multilayered-structure 407.

Figure 5:
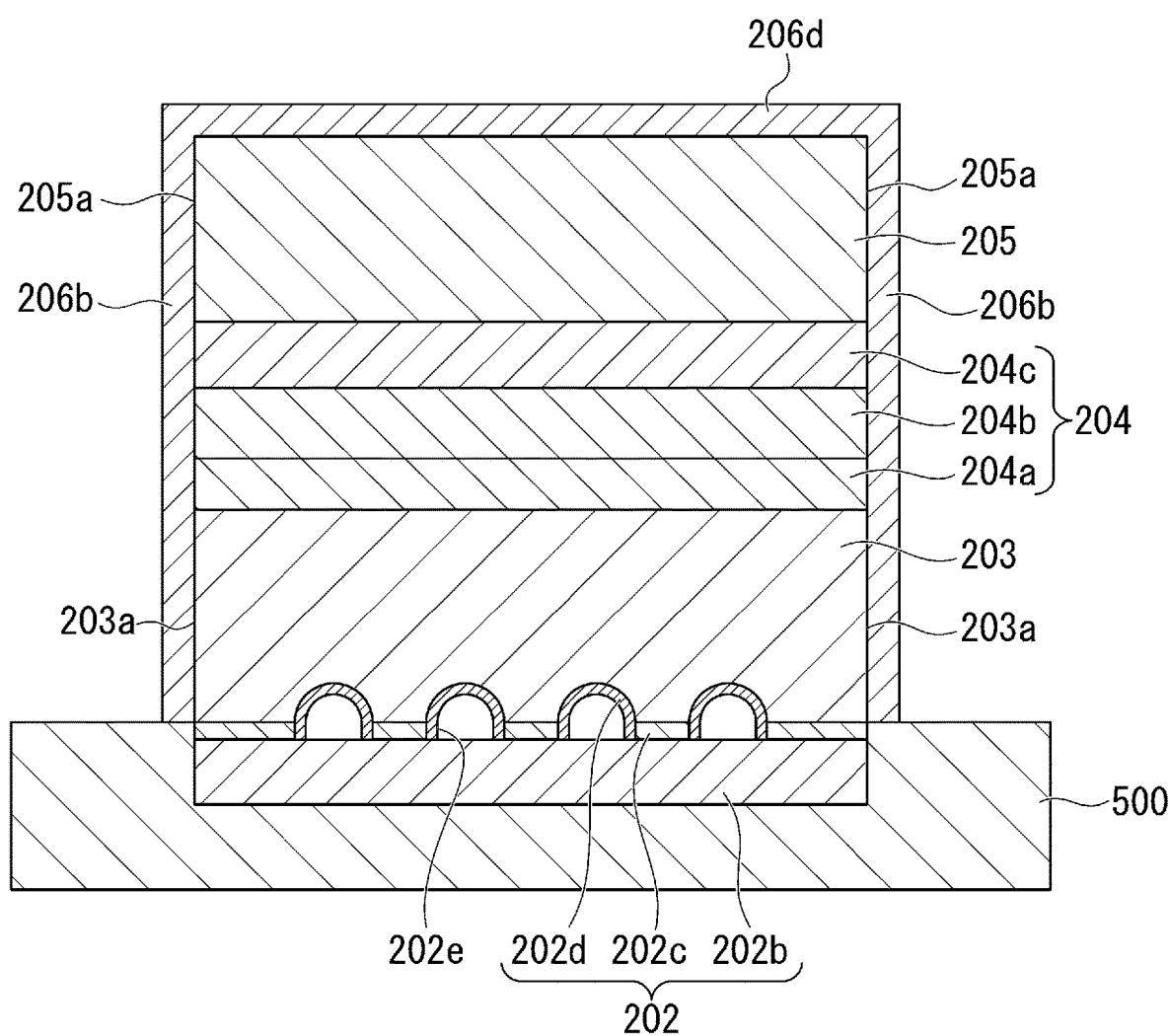
FIG. 5 is a process diagram illustrating a method of manufacturing the multilayer junction photoelectric converter of the third embodiment.

FIG. 5 shows the intermediate multilayered-structure 407 after the second functional layer 206d is formed. In the example shown in FIG. 5, the intermediate multilayered-structure 407 is attached to a jig 500 when performing atomic layer deposition. The jig 500 covers the first electrode functional layer 202. Since the first electrode functional layer 202 is covered with the jig 500, the second functional layer 206d is formed on the second photoactive layer 205 and is also formed on a portion in which the second photoactive layer 205 has a multilayered structure from the first photoactive layer 203 in the edge surface 207a of the intermediate multilayered-structure when the second functional layer 206d is formed by atomic layer deposition. In this way, the second functional layer 206d including the covering layer 206b is formed.

Figure 6:
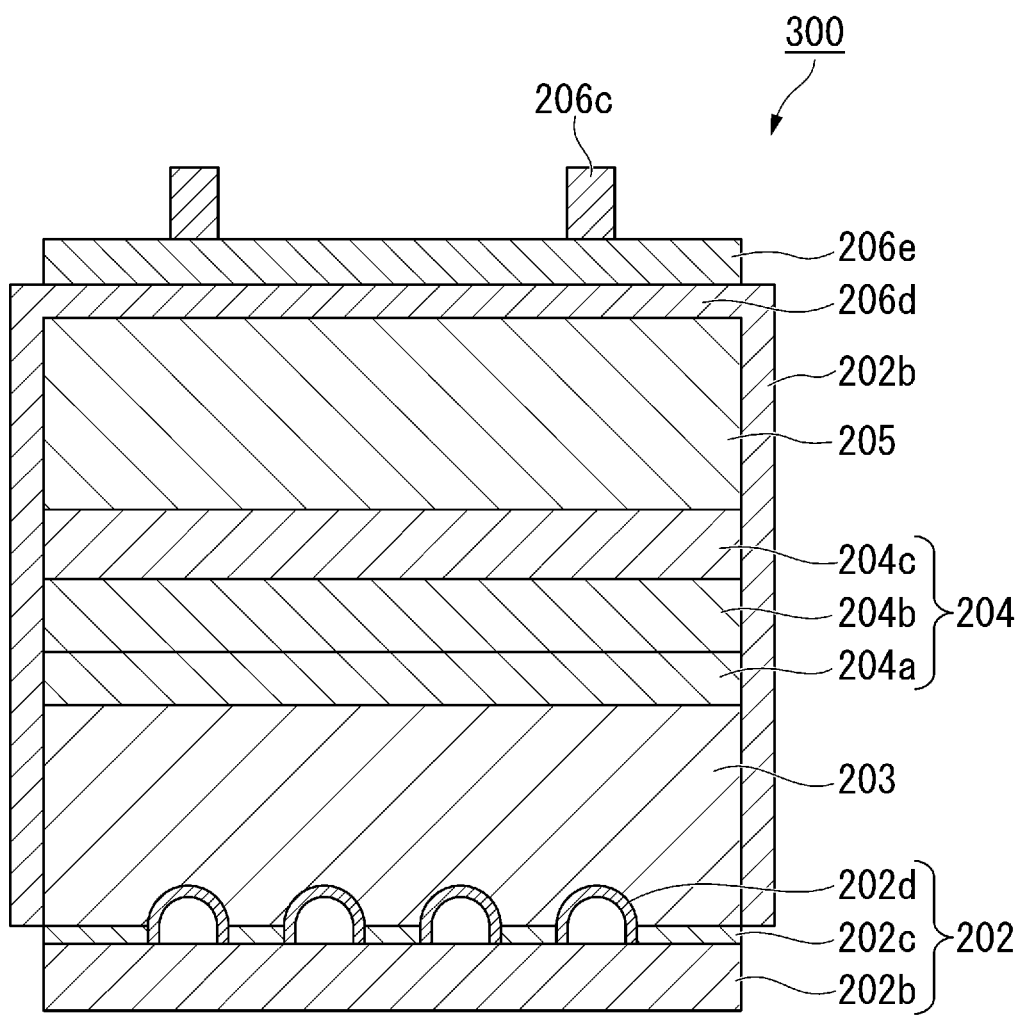
FIG. 6 is a process diagram illustrating a method of manufacturing the multilayer junction photoelectric converter of the third embodiment.

Next, as shown in FIG. 6, the second transparent electrode 206e and the second metal electrode 206c are formed by, for example, sputtering. As described above, the multilayer junction photoelectric converter 300 shown in FIG. 3 is manufactured.

According to the manufacturing method of this embodiment, since the covering layer 204b covering at least the end portion of the second photoactive layer 205 can be formed at the same time of forming the second functional layer 206d by forming the second functional layer 206d by atomic layer deposition, the process is simplified.

Further, since the jig 500 covering at least the first electrode functional layer 202 is attached to the intermediate multilayered-structure 407 when the second functional layer 206d is formed by atomic layer deposition, the second functional layer 206d is not multilayered on the first electrode functional layer 202. Accordingly, there is no risk of short circuiting between the first electrode 202b and the second transparent electrode 206e of the multilayer junction photoelectric converter 300.

Additionally, when the multilayer junction photoelectric converter 200 shown in FIG. 2 is manufactured, a jig covering a portion except for the end portion of the second photoactive layer 205 in the edge surface 407a of the intermediate multilayered-structure 407 is used instead of the jig 500 and the second functional layer 206d may be formed by atomic layer deposition while the jig is attached to the intermediate multilayered-structure.

Fourth Embodiment

Next, a multilayer junction photoelectric converter of a fourth embodiment and a manufacturing method thereof will be described.

Figure 7:
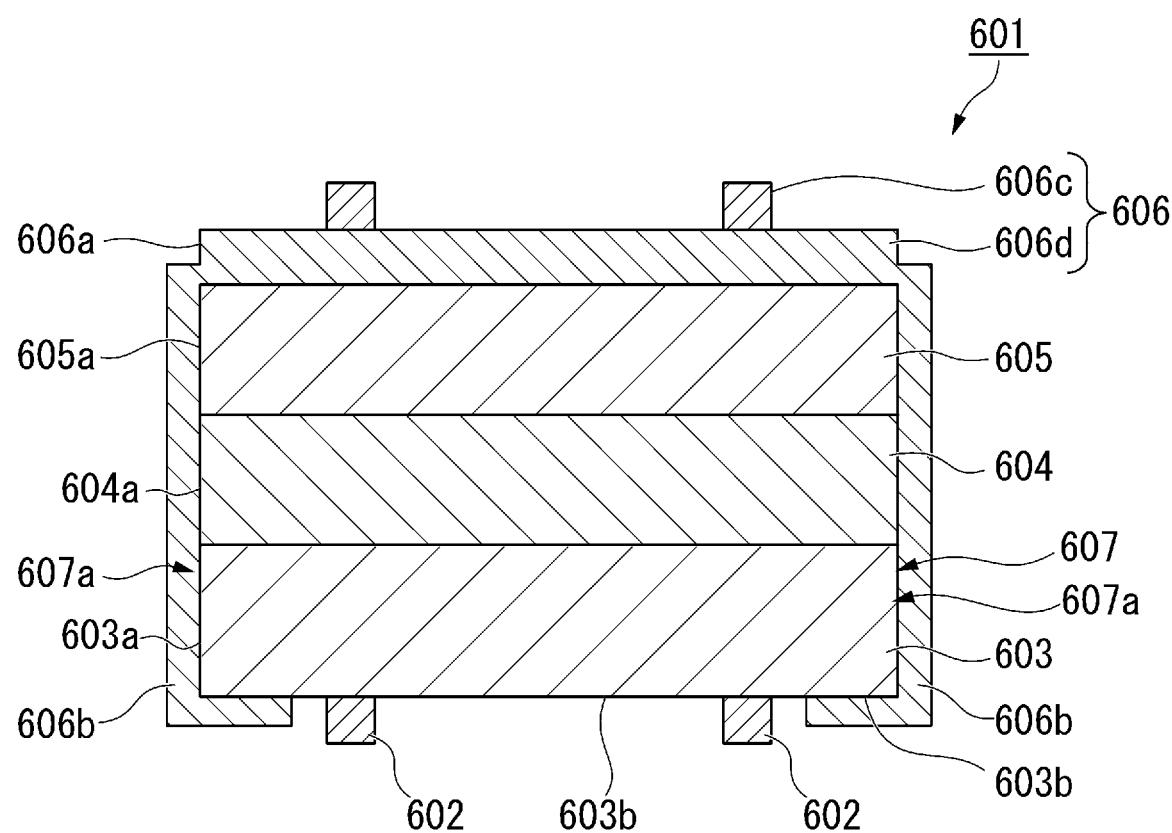
FIG. 7 is a schematic cross-sectional view showing another example of a multilayer junction photoelectric converter of a fourth embodiment.

A multilayer junction photoelectric converter 601 shown in FIG. 7 is configured by a multilayered-structure 607 obtained by stacking a first electrode functional layer 602, a first photoactive layer 603 made of crystalline silicon, an intermediate functional layer 604, a second photoactive layer 605 made of a photoactive material having a perovskite crystal structure, and a second electrode functional layer 606. In the multilayer junction photoelectric converter 601 shown in FIG. 7, the light receiving surfaces of the first photoactive layer 603 and the second photoactive layer 605 are the surfaces on the side of the second electrode functional layer 606.

An end portion 603a of the first photoactive layer 603, an end portion 604a of the intermediate functional layer 604, an end portion 605a of the second photoactive layer 605, and an end portion 606a of the second electrode functional layer 606 are located on an edge surface 607a of the multilayered-structure 607.

The multilayer junction photoelectric converter 601 shown in FIG. 7 extends so that a partial layer 606b included in the second electrode functional layer 606 is included in the multilayered-structure 607 and at least the entire part of the edge surface 7a of the multilayered-structure 607 is covered. In the example shown in FIG. 7, the partial layer 606b included in the second electrode functional layer 606 is formed so that the entire part of the edge surface 607a of the multilayered-structure 607 is covered and a part of the lower surface 603b of the first photoactive layer 603 is covered. However, the partial layer 606b does not contact the first electrode functional layer 602.

The first electrode functional layer 602 is formed in a strip shape as shown in FIG. 7. FIG. 7 shows the first electrode functional layer 602 as a cross-section orthogonal to the longitudinal direction of the strip-shaped first electrode functional layer 602.

The first photoactive layer 603, the intermediate functional layer 604, and the second photoactive layer 605 may be the same as the first photoactive layer 3, the intermediate functional layer 4, and the second photoactive layer 5 of the first embodiment.

The second electrode functional layer 606 may include a second electrode 606c and a second functional layer 606d which is disposed between the second electrode 606c and the second photoactive layer 605. The second functional layer 606d covers at least the edge surface 607a of the multilayered-structure 607 as the partial layer 606b included in the second electrode functional layer 606.

The multilayer junction photoelectric converter 1 shown in FIG. 1 is a tandem solar cell having a structure in which two photoactive layers 603 and 605 are provided, the unit having the second photoactive layer 605 is a top cell, the unit having the first photoactive layer 603 is a bottom cell, and these are connected in series by the intermediate functional layer 604. The first electrode functional layer 602 and the second electrode functional layer 606 serve as anodes or cathodes, from which electrical energy generated by the element is extracted.

In the multilayer junction photoelectric converter 601 shown in FIG. 7, the partial layer 606b included in the second electrode functional layer 606 covers at least the edge surface 607a of the multilayered-structure 607. The end portion 605a of the second photoactive layer 605 is covered with the partial layer 606b included in the second electrode functional layer 606. Accordingly, there is no risk that water enters the second photoactive layer 605 from the outside of the element 601 and there is no risk that the photoactive material forming the second photoactive layer 605 and having a perovskite crystal structure is decomposed by water. Accordingly, this can prevent the short circuit of the top cell.

Further, since the partial layer 606b included in the second electrode functional layer 606 covers at least the entire part of the edge surface 607a of the multilayered-structure 607, the entry path until moisture reaches the second photoactive layer 605 is lengthened. Accordingly, the entry of moisture is greatly limited and the risk of decomposing the photoactive material forming the second photoactive layer 605 by water is little. Accordingly, the short circuit of the top cell can be more reliably prevented.

Next, a method of manufacturing the multilayer junction photoelectric converter 601 shown in FIG. 7 will be described with reference to FIGS. 8 to 10.

The manufacturing method of this embodiment includes a step of stacking the second electrode functional layer on the intermediate multilayered-structure. This step includes a stacking step of forming a partial layer included in the second electrode functional layer by atomic layer deposition. In the stacking step, the partial layer included in the second electrode functional layer extends on the second photoactive layer of the intermediate multilayered-structure and on the end portion of the second photoactive layer at the edge surface of the intermediate multilayered-structure. Particularly, in the stacking step of this embodiment, the partial layer included in the second electrode functional layer extends on the second photoactive layer of the intermediate multilayered-structure and on at least the entire surface of the edge surface of the intermediate multilayered-structure. Further, in the stacking step, the partial layer included in the second electrode functional layer may be on a part of the lower surface 603b on the side of the first electrode functional layer 602 in the first photoactive layer.

Figure 8:
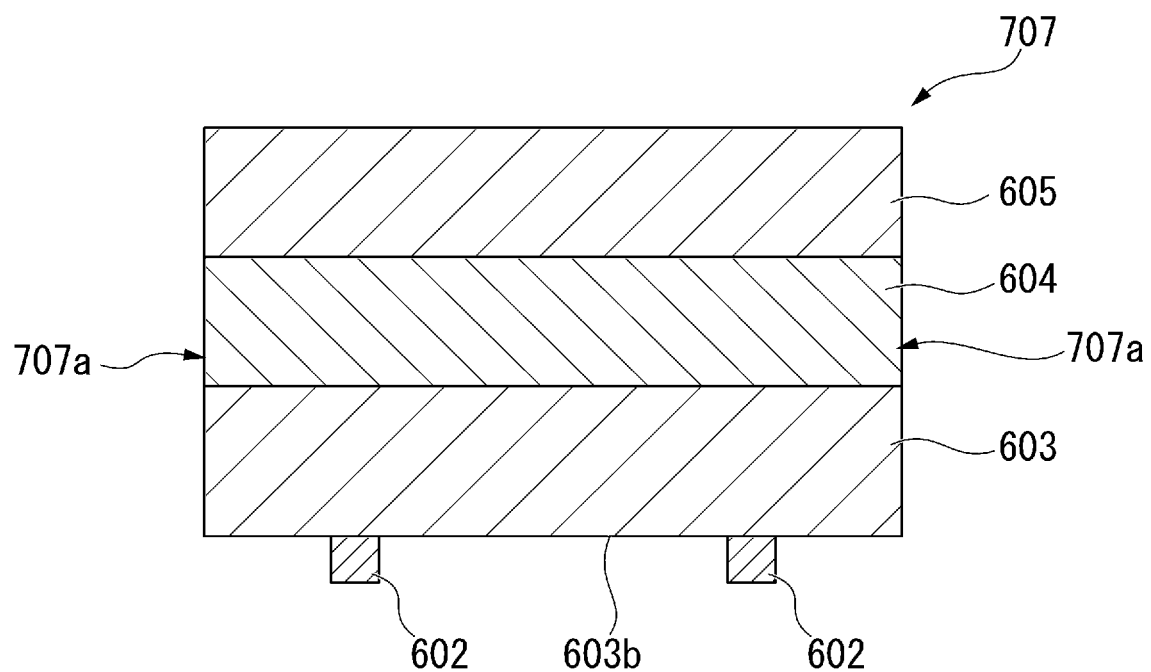
FIG. 8 is a process diagram illustrating a method of manufacturing the multilayer junction photoelectric converter of the fourth embodiment.

As shown in FIG. 8, an intermediate multilayered-structure 707 includes the first electrode functional layer 602, the first photoactive layer 603 made of crystalline silicon, the intermediate functional layer 604, and the second photoactive layer 605 made of a photoactive material having a perovskite crystal structure.

The method of manufacturing the intermediate multilayered-structure 407 is not particularly limited, but the intermediate multilayered-structure may be manufactured, for example, in the following procedure.

That is, a crystalline silicon substrate which is the first photoactive layer 603 is prepared and the first electrode functional layer 602 is formed on one surface thereof. Next, the intermediate functional layer 604 and the second photoactive layer 605 having a perovskite crystal structure are sequentially multilayered on the other surface of the crystalline silicon substrate which is the first photoactive layer 603.

The intermediate functional layer 604 is preferably manufactured by, for example, sputtering. From the viewpoint of cost, it is preferable to form the second photoactive layer 605 by a coating method, for example, as described in the third embodiment.

As described above, the intermediate multilayered-structure 707 is manufactured.

Next, a step of stacking the second electrode functional layer on the second photoactive layer 605 of the intermediate multilayered-structure 707 is performed. The step of stacking the second electrode functional layer includes a step of forming the second functional layer 606d and a step of forming the second electrode 606c.

Figure 9:
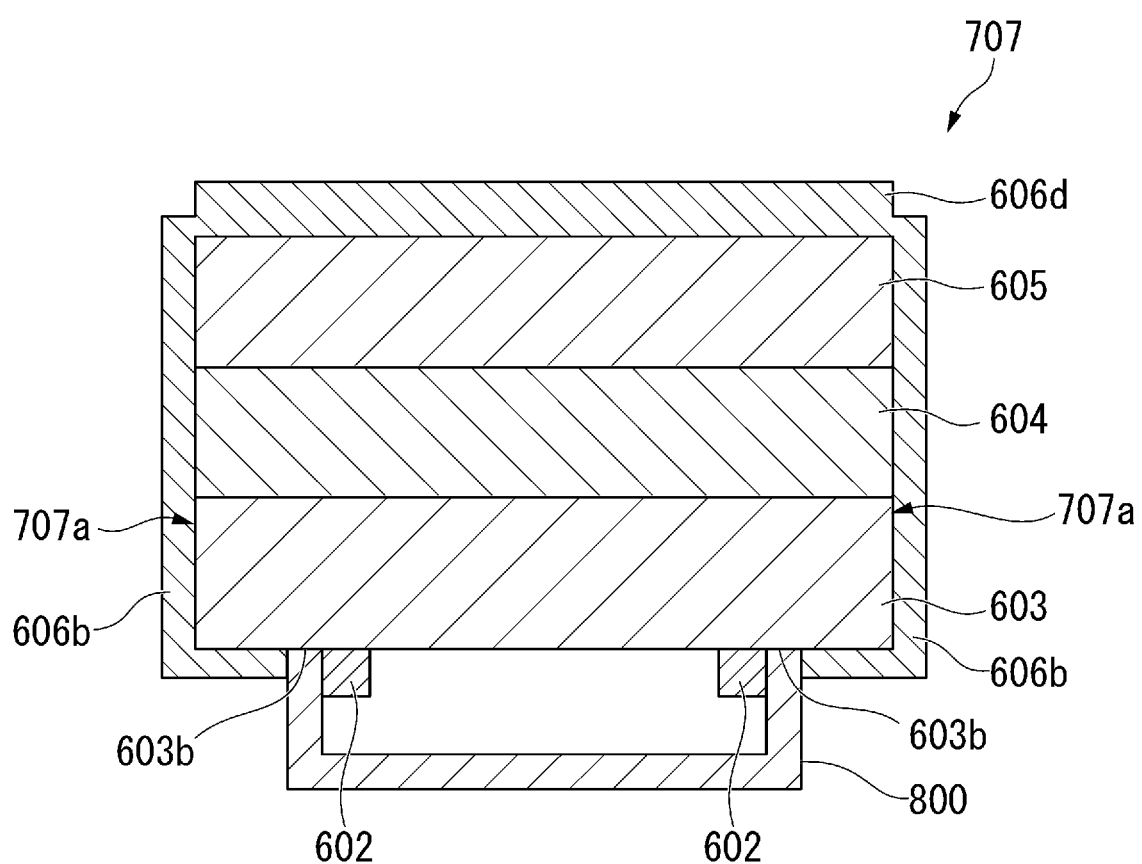
FIG. 9 is a process diagram illustrating a method of manufacturing the multilayer junction photoelectric converter of the fourth embodiment.

As shown in FIG. 9, in the step of forming the second functional layer 606d, a jig 800 is attached to the intermediate multilayered-structure 707 and then the second functional layer 606d constituting a part of the second electrode functional layer 606 is formed by atomic layer deposition. In the atomic layer deposition, a surface on which the second functional layer 606d is formed is alternately exposed to a plurality of vapor-phase raw materials (precursors) to form the second functional layer 606d. Accordingly, the second functional layer 606d is formed on the upper surface of the second photoactive layer 605 and its part 606b is also multilayered on a part of the edge surface 607a of the intermediate multilayered-structure 707 and the lower surface 603b of the first photoactive layer 603.

The jig 800 has a hollow box shape that covers the first electrode functional layer 602 and contacts the lower surface 603b of the first photoactive layer 603. Since the first electrode functional layer 602 is covered with the jig 800, the second functional layer 606d is formed on the second photoactive layer 605 without bonding to the first electrode functional layer 602 and its part 606b is formed on the entire part of the edge surface 707a of the intermediate multilayered-structure 707 and a part of the lower surface 603b of the first photoactive layer 603 when the second functional layer 606d is formed by atomic layer deposition. In this way, the second functional layer 206d is formed.

The range of stacking the second functional layer 606d and its part 606b can be adjusted by changing the shape of the jig 800. For example, the second functional layer 606d and its part 606b can be multilayered on the second photoactive layer 605 to cover the entire surface of the second photoactive layer 605 and the edge surface 707a of the intermediate multilayered-structure 707 by using a jig covering the first electrode functional layer 602 and the entire part of the lower surface 603b of the first photoactive layer 603 as another example of the jig.

Figure 10:
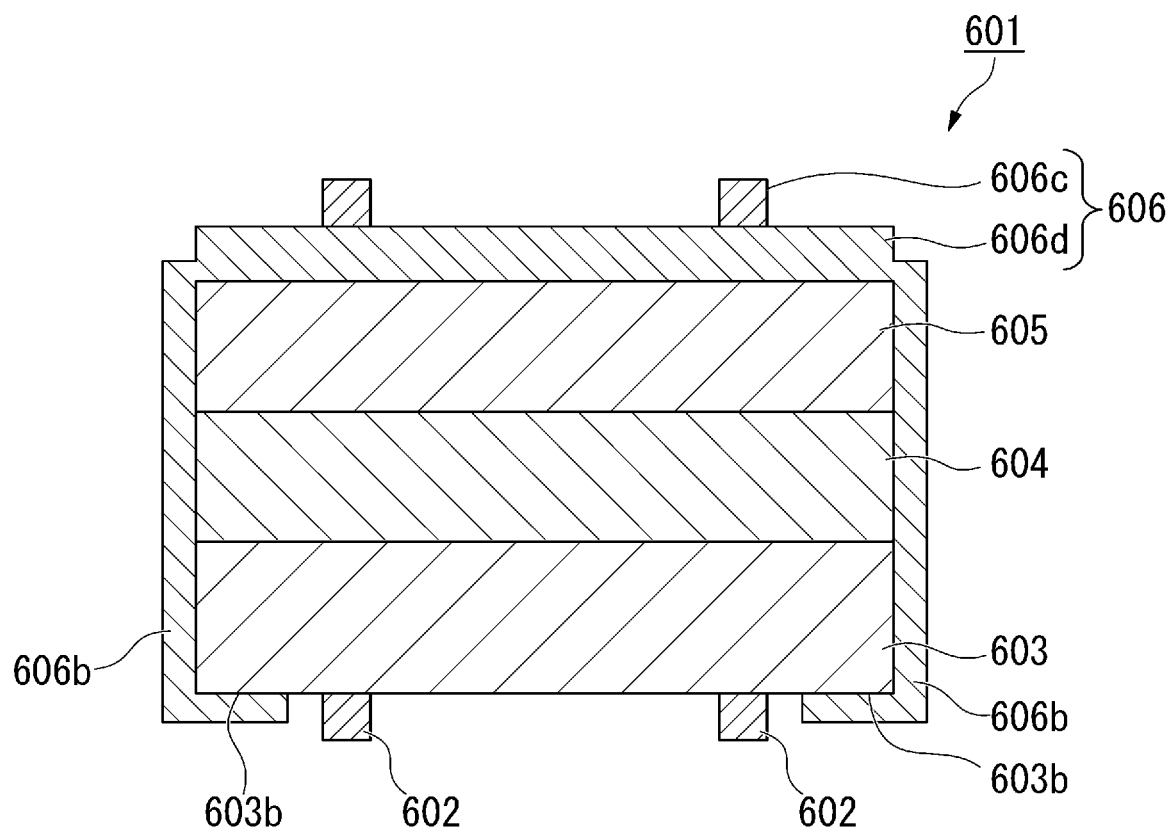
FIG. 10 is a process diagram illustrating a method of manufacturing the multilayer junction photoelectric converter of the fourth embodiment.

Next, as shown in FIG. 10, the second electrode 606c is formed by, for example, sputtering. As described above, the multilayer junction photoelectric converter 601 shown in FIG. 7 is manufactured.

According to at least one embodiment described above, since the covering layer which extends on the edge surface of the multilayered-structure to cover the end portion of the second photoactive layer at the edge surface is provided, it is possible to prevent water from contacting the second photoactive layer made of a photoactive material having a perovskite crystal structure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A multilayer junction photoelectric converter comprising:
a multilayered-structure comprising: a first electrode functional layer; a first photoactive layer of crystalline silicon extending over the first electrode functional layer; an intermediate functional layer extending over the first photoactive layer; a second photoactive layer of a photoactive material having a perovskite crystal structure, the second photoactive layer extending over the intermediate functional layer; and a second electrode functional layer extending over the second photoactive layer,
wherein the second electrode functional layer includes a second functional layer of inorganic oxide on the second photoactive layer and functions as one of a hole injection layer and an electron transport layer, and a second electrode on the second functional layer,
wherein the second photoactive layer has a top surface and an edge surface extending in vertical to the top surface, wherein the second functional layer extends on the top surface of the second photoactive layer to cover the top surface of the second photoactive layer, and further the second functional layer extends on an entire part of the edge surface of the multilayered-structure to cover the entire part of the edge surface of the multilayered-structure, wherein the second functional layer comprises titanium oxide or tin oxide, and wherein the second functional layer has a thickness in the range of 5 nm to 30 nm.

2. The multilayer junction photoelectric converter according to claim 1, wherein the first electrode functional layer includes a first electrode, a passivation film which is disposed between the first electrode and the first photoactive layer, and a first conductive layer which penetrates the passivation film and electrically connects the first electrode and the first photoactive layer, wherein the intermediate functional layer includes a second conductive layer on the first photoactive layer, a transparent electrode layer, and a first functional layer which is disposed between the transparent electrode layer and the second photoactive layer.

3. The multilayer junction photoelectric converter according to claim 1, wherein the second functional layer comprises an atomic layer deposition layer.

\* \* \* \* \*